United States Patent
Boccuzzi et al.

(10) Patent No.: US 7,061,340 B2
(45) Date of Patent: Jun. 13, 2006

(54) DIFFERENTLY-TUNED VCO USING INDUCTIVELY COUPLED VARACTORS

(75) Inventors: Vito Boccuzzi, Lebanon, NJ (US); Robert Charles Frye, Piscataway, NJ (US); Sander Lauentius Gierkink, Hoboken, NJ (US)

(73) Assignee: Agere Systems, Inc., Allentown, PA (US)

( * ) Notice: Subject to any disclaimer, the term of this patent is extended or adjusted under 35 U.S.C. 154(b) by 40 days.

(21) Appl. No.: 10/816,280

(22) Filed: Apr. 1, 2004

(65) Prior Publication Data

US 2004/0196110 A1  Oct. 7, 2004

Related U.S. Application Data

(60) Provisional application No. 60/460,330, filed on Apr. 4, 2003.

(51) Int. Cl.
*H03B 1/00* (2006.01)

(52) U.S. Cl. .................. 331/177 V; 331/117 FE; 331/167; 331/117 R; 331/179

(58) Field of Classification Search ............ 331/117 R, 331/117 FE, 167, 177 V, 179
See application file for complete search history.

(56) References Cited

U.S. PATENT DOCUMENTS 6,803,829 B1 * 10/2004 Duncan et al. ............... 331/34

OTHER PUBLICATIONS

Fong, N. et al., "A 1-V 3.8-5.7-GHz Wide-Band VCO with Differentially Tuned Accumulation MOS Varactors for Common-Mode Noise Rejection in CMOS SOI Technology", IEEE Transactions on Microwave Theory and Techniques, vol. 51, No. 8, Aug. 2003, pp. 1952-1059.

Kapur and Long, "IES: Efficient Electrostatic and Electromagnetic Simulation", IEEE Computational Science & Engineering, Oct.-Dec. 1998, pp. 60-67.

Behbahani and Abidi, "RF-CMOS Oscillators with Switched Tuning", IEEE 1998 Custom Integrated Circuits Conference, pp. 555-558.

Levantino et al., "Frequency Dependence on Bias Current in 5-GHz CMOS VCOs: Impact on Tuning Range and Flicker (Continued)

*Primary Examiner*—Arnold Kinkead
(74) *Attorney, Agent, or Firm*—Duane Morris, LLP

(57) ABSTRACT

A differently-tuned voltage controlled oscillator (VCO) and its application in a multi-band VCO tuner are disclosed. In one aspect of the invention, the VCO comprises a plurality of serially connected inductive elements each including inductively coupled inductor elements, a varactor element connected in parallel with the serially connected first inductor elements and means to apply a first and second tuning voltage to elements of the varactor element. In a second aspect, the VCO further comprises a second varactor element connected in parallel with the inductive elements, and means to apply the second tuning voltage elements of the second varactor element.

14 Claims, 9 Drawing Sheets

OTHER PUBLICATIONS

Noise Upconversion", IEEE Journal of Solid-State Circuits, vol. 37, No. 8, Aug. 2002, pp. 1003-1011.

Magierowski et al., "Differentially Tunable Varactor with Build-In Common-Mode Rejection", 2002 IEEE, pp. I-559-I-562.

Tiebout, M, "Low-Power Low-Phase-Nose Differentially Tuned Quadrature VCO Design in Standard CMOS", IEEE Journal of Solid-State Circuits, vol. 36, No. 7, Jul. 2001, pp. 1018-1024.

* cited by examiner though the first inductor elements, wherein the first tuning voltage is applied
DIFFERENTLY-TUNED VCO USING INDUCTIVELY COUPLED VARACTORS

RELATED APPLICATION

This application claims the benefit, pursuant to 35 U.S.C. 119(e), of the earlier filing date afforded:

U.S. Provisional Application Ser. No. 60/460,330, entitled "Differentially "Bathtub"—Tuned CMOS VCO Using Inductively Coupled Varactors," filed on Apr. 4, 2003 and which is incorporated by reference herein.

FIELD OF INVENTION

This application relates to Voltage-Controlled Oscillators and more specifically to oscillators with differential tuning based on inductively-coupled varactors.

BACKGROUND OF THE INVENTION

With the emerging market for the wireless LAN (local area network) standards, the need exists to provide radio solutions that integrate these standards together with the popular 802.11b standard into a single receiver. Preferably, a single VCO in combination with selectable frequency division capable of covering the 802.11a, b and g frequency bands, i.e., 2.4–2.5, 2.4–2.6 and 5.1–5.8 GHz, respectively, is needed. However, the obtainment of a wide VCO tuning range in combination with a low tuning constant $K_{vco}$ is ever more challenging. A low $K_{vco}$, is desirable for the PLL (phase-locked-loop) design and for the minimization of the VCO's sensitivity to noise and supply variations.

Band switching in addition to differential VCO tuning are known methods used to reduce the $K_{vco}$ over the extended frequency range. Differential VCO tuning also provides significant reduction in up-converted common-mode (bias) noise into phase noise and in the oscillator's sensitivity to supply- and bias variations. Several techniques exist to implement differential tuning. As the varactor's capacitance is determined by the voltage across its terminals, one can decouple a varactor capacitively from the oscillator's output nodes and bias both its terminals differentially. However, this will reduce the oscillation swing across the varactor, resulting in a highly non-linear tuning curve.

Alternatively, p-type and n-type varactors can be combined using simple NMOS and PMOS transistors in inversion mode. However, standard MOSFET transistors, used in differentially tuned VCO are not optimized for a maximum $C_{max}/C_{min}$-ratio or Q. Also, the C(V) curves of NMOS and PMOS devices are not well matched and can cause a loss of CMRR (Common-Mode Rejection Ratio), i.e. the circuit's ability to reject variations in its common-mode tuning levels that affect the frequency of oscillation.

Another approach is to use a combination of p- and n-type accumulation-depletion mode varactors. However, this requires a triple well process that adds to the cost. Finally, one could use only PMOS accumulation-depletion varactors, and connect the gates of one set of varactors to the outputs and tune it through the well side, and connect the well sides of a second set of varactors to the outputs and tune this set through the gate sides. However, in that case the oscillator is loaded with the large, low-Q parasitic capacitance between the well and the substrate; this will negatively affect the oscillator's phase noise and tuning range.

Hence, there is a need for a VCO differential tuning device, i.e, a tuner, that allows a VCO to be tuned differentially and that preserves maximum oscillation swing across the varactors and thus maximizes the tuning linearity of the VCO.

SUMMARY OF INVENTION

A differently-tuned voltage controlled oscillator (VCO) and its application as a multi-band VCO tuner are disclosed. In one aspect of the invention, the VCO comprises a plurality of inductive elements, each comprising inductively coupled first and second inductor elements wherein corresponding ones of the first inductor elements and second conductor elements are connected in series, a varactor element connected in parallel with the serially connected first inductor elements, the varactor element comprising serially well-to-well connected first and second same-type varactors, each having a well side and a gate side, means to apply a first tuning voltage to a node common to the first inductor elements, wherein the first tuning voltage is applied to the gate-side of each of the first and second varactors through the first inductor elements and means to apply a second voltage to a node common to said well-side of said first and second varactors. In a second aspect, a second varactor element is connected in parallel with the second inductor elements associated with the inductive elements, the second varactor element comprises serially-connected same-type first and second varactors each having a well side and a gate side, and means to apply the second tuning voltage to a node common to the second varactor element first and second varactors, wherein the second tuning voltage is applied to the well-side of each of said first and second varactors.

Figure 1:
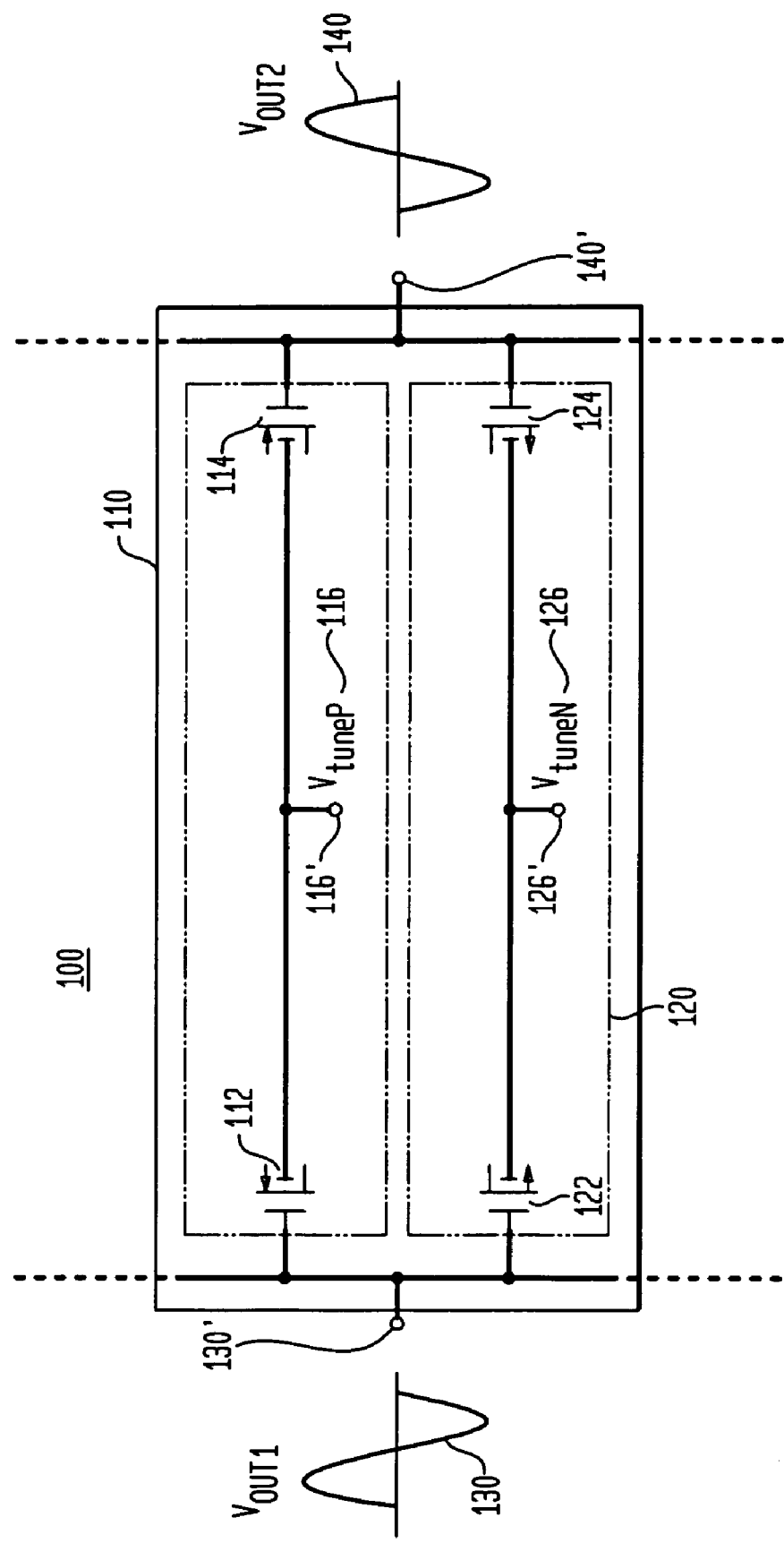
FIG. 1 illustrates a conventional differential tuner using n- and p-type varactors in accumulation mode.

It is to be understood that these drawings are solely for purposes of illustrating the concepts of the invention and are not intended as a definition of the limits of the invention. The embodiments shown in the figures herein and described in the accompanying detailed description are to be used as illustrative embodiments and should not be construed as the only manner of practicing the invention. Also, the same reference numerals, possibly supplemented with reference characters where appropriate, have been used to identify similar elements.

DETAILED DESCRIPTION

FIG. 1 illustrates a conventional dual type varactor differential tuner 100 including accumulation-depletion varactor stages 110 and 120, which are operable to output signals $V_{out1}$ 130 and $V_{out2}$ 140 on nodes 130' and 140', respectively. The frequency of signals $V_{out1}$ 130 and $V_{out2}$ 140, as is known in the art, is determined by the capacitance value of tuner 100, in combination with the fixed inductance across the nodes 130' and 140'.

Varactor stage 110 includes, in this illustrated example, dual PMOS accumulation-depletion varactors 112 and 114 and varactor stage 120, similarly, includes dual NMOS accumulation-depletion varactors 122 and 124. To illustrate the operation of the conventional dual type varactor, the contribution of PMOS varactor 112 to the single-ended capacitance seen from node 130' to ground, referred to as $C_1$, may be determined and adjusted by varying the value of a tuning voltage or potential 116, referred to as $V_{tunep}$, that is applied through node 116' to the well-side of varactors 112 and 114. Similarly, the contribution of NMOS varactor 122 to the single-ended capacitance seen from node 130' to ground, referred to as $C_2$, may be determined and adjusted by varying the value of another tuning voltage or potential 126, referred to herein as $V_{tunen}$, that is applied at node 126' to the well-side varactors 122 and 124. A similar analysis may be performed to determine the contributions of PMOS varactor 114 and NMOS varactor 124 to the single-ended capacitance seen from node 140' to ground and need not be discussed in detail herein.

Figure 2A:
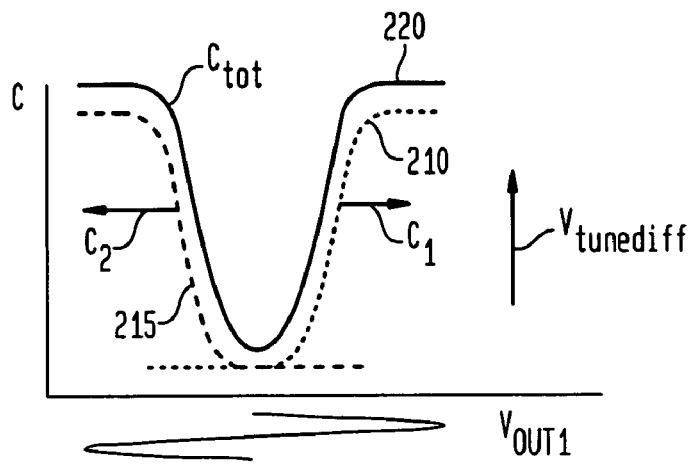
FIGS. 2a–2c illustrate the operating characteristics of the tuner shown in FIG. 1 when tuned in differential mode.
Figure 2B:
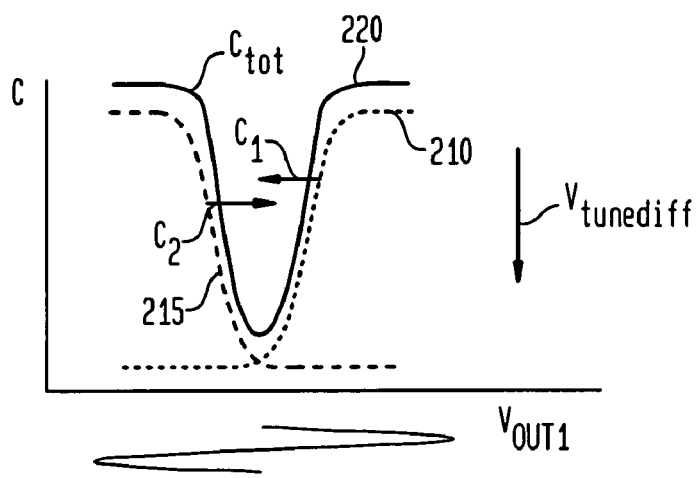

FIGS. 2a and 2b illustrate the small-signal capacitance as a function of voltage, i.e., C(V) curves, as a function of the difference, i.e., $V_{tunediff}$, between voltages $V_{tunep}$ and $V_{tunen}$, i.e., tuning voltages. In one case, as shown in FIG. 2a, as $V_{tunediff}$ increases, the value of the capacitance of $C_1$ 210 and $C_2$ 215 diverges and the width of the minimum in the C(V) curve, i.e., $C_{tot}$ 220, also increases. In the case shown in FIG. 2b, as $V_{tunediff}$ decreases, the value of the capacitance of $C_1$ 210 and $C_2$ 215 diverges and the width of the minimum in the C(V) curve decreases.

The large-signal output waveform $V_{out1}$ cycles through these small-signal C(V) curves during each period of oscillation. As a result, the average capacitance experienced by the output $V_{out1}$ and $V_{out2}$ which is not shown, determines the frequency of oscillation. In this case, as capacitance decreases the frequency of oscillation increases.

Figure 2C:
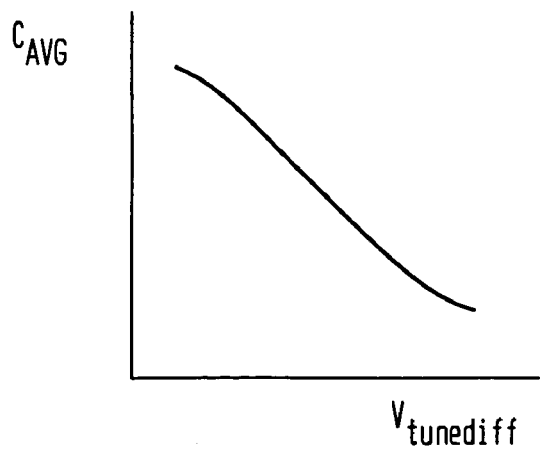

FIG. 2c illustrates the change in the average capacitance of $C_{tot}$ 220 and consequently of the differential tuner 100, as a function of $V_{tunediff}$. As shown, in a "differential" mode of operation as $V_{tunediff}$ increases, the average capacitance decreases substantially and, hence, the frequency of $V_{out1}$, 130 and $V_{out2}$ 140 increases substantially.

Figure 3A:
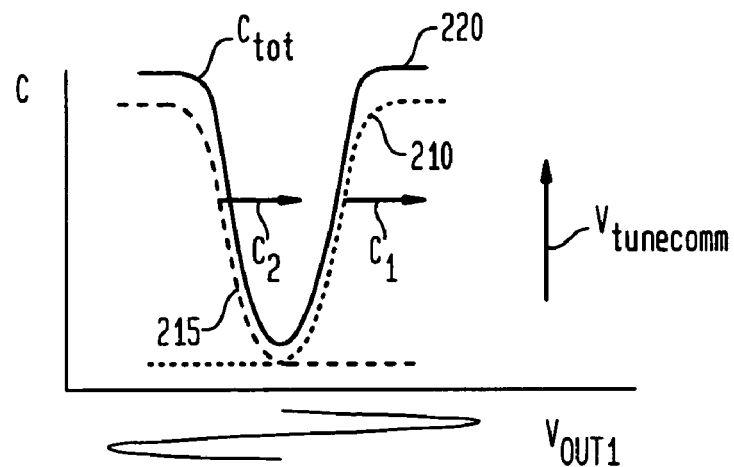
FIGS. 3a–3c illustrate the operating characteristics of the tuner shown in FIG. 1 when tuned in common mode.
Figure 3B:
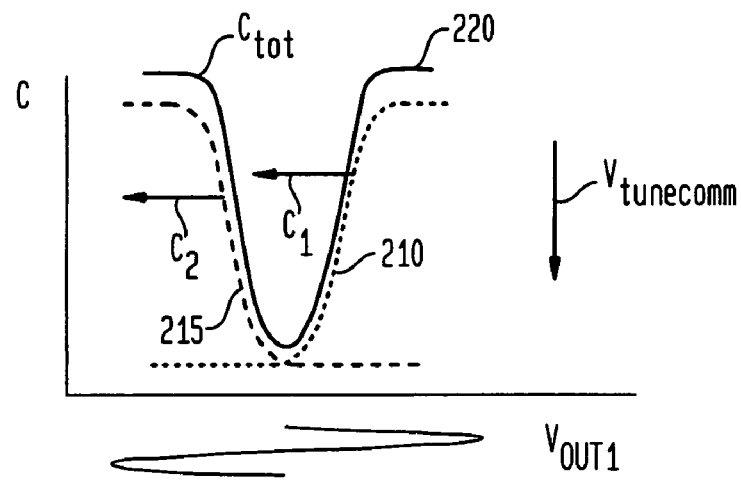
Figure 3C:
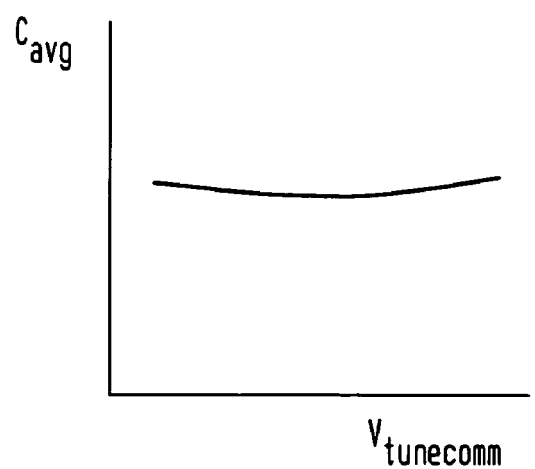

FIGS. 3a and 3b illustrate the change in value of capacitances $C_1$ 210 and $C_2$ 215 as the combined value of $V_{tunep}$ and $V_{tunen}$, commonly referred to as $V_{tunecomm}$, increases and decreases, respectively. For example, $V_{tunecomm}$ may be an average value of $V_{tunen}$ and $V_{tunep}$. FIG. 3c illustrates the change in the average capacitance of $C_{tot}$ 220 as a function of $V_{tunecomm}$. In this common mode of operation, as the common voltage $V_{tunecomm}$ changes, the average capacitance remains substantially constant and, hence, the frequency of $V_{out1}$ 130 and $V_{out2}$ 140 remains substantially constant.

Figure 4:
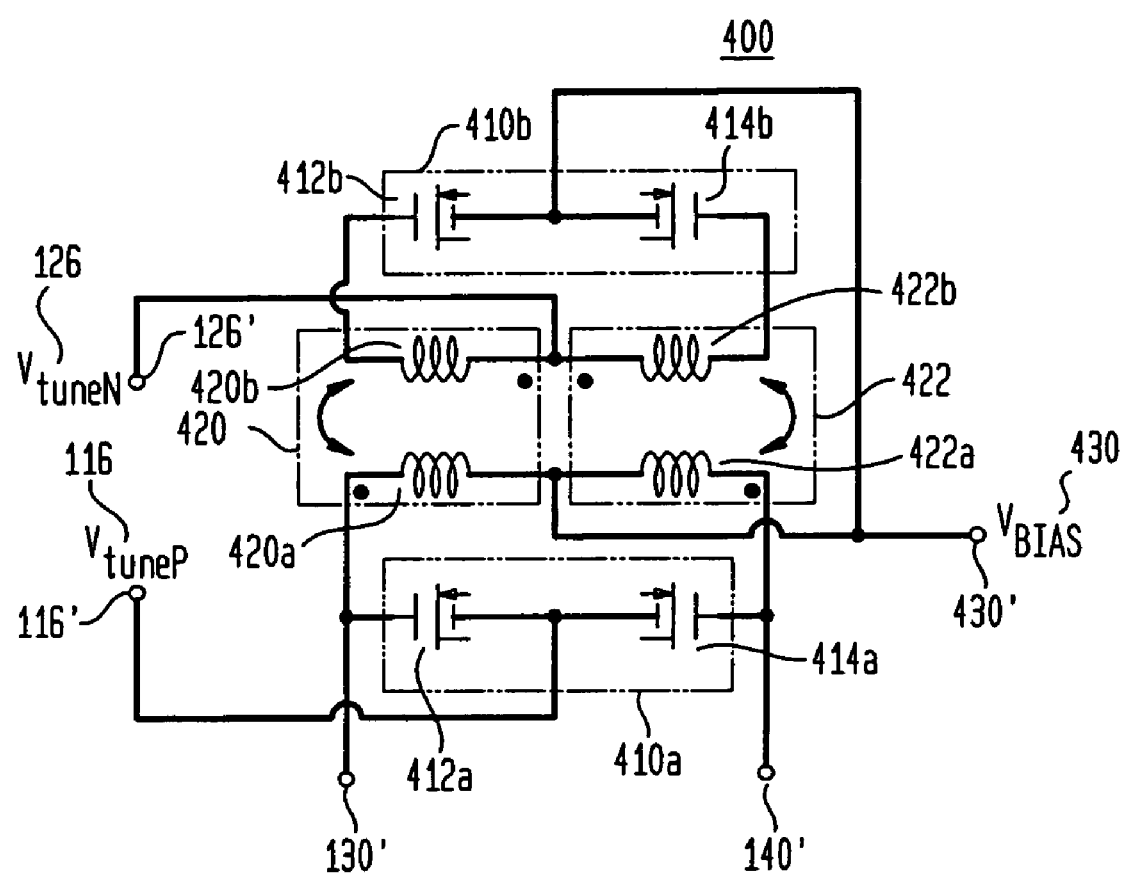
FIG. 4 illustrates a first exemplary single-type differential tuner in accordance with the principles of the present invention.

FIG. 4 illustrates a first exemplary embodiment 400 of a single-type varactor differential tuner in accordance with the principles of the invention. In this illustrated embodiment, a first n-type varactor stage 410a, containing PMOS varactors 412a, 414a, is responsive to voltage $V_{tunep}$ 116, applied through node 116' to the well-side of each of the serially-connected PMOS varactors 412a, 414a. Second varactor stage 410b, containing PMOS varactors 412b, 414b, is responsive to voltage $V_{tunen}$ 126, applied through node 126' to the gate-side of PMOS varactors 412b, 414b, through inductors 420b and 422b.

Inductive elements 420 and 422 electromagnetically couple varactor elements 412a and 414a in stage 410a to corresponding varactor elements 412b and 414b in varactor stage 410b. As shown, the windings of inductive elements 420a, 420b and 422a, 422b are reversed such that the oscillation signal, present at the gates of the varactor stage 410b, is inverted with respect to the oscillation signal, present at the gates of varactor stage 410a.

Thus, in this embodiment, the contribution of PMOS varactor 412a to the single-ended capacitance i.e., $C_1$ seen from node 130' to ground, and the contribution of PMOS varactor 412b to the single-ended capacitance, i.e., $C_2$, seen from node 130' to ground operates as discussed with regard to FIGS. 2a–2c for differential-mode tuning and FIGS. 3a–3c for common-mode tuning. Hence, as the varactor capacitance $C_1$ increases due to an increase in $V_{out1}$ on node 130', the capacitance $C_2$ decreases, due to the signal inversion performed by the coupled inductors.

Further illustrated is voltage $V_{bias}$ 430 applied at node 430'. Voltage $V_{bias}$ 430 is provided to the common node of inductors 420a and 422a such that voltage $V_{bias}$, through inductor elements 420a and 422a, is superimposed on signals $V_{out1}$ 130 and $V_{out2}$ 140. $V_{bias}$ 430 also provides a necessary current to a transconductor, as will be discussed with regard to FIG. 5, that is needed to sustain the oscillation of signals $V_{out1}$ 130 and $V_{out2}$. To ensure that the varactor stage 410b has a similar DC bias point as varactor stage 410a, the well-side of varactor section 410b is connected to the fixed voltage $V_{bias}$ 430. The application of $V_{bias}$ 430 to $V_{out1}$ 130 and $V_{out2}$ 140 allows a maximum amplitude variation about a non-zero DC-biased reference value equal to substantially one-half the supply voltage.

Figure 5:
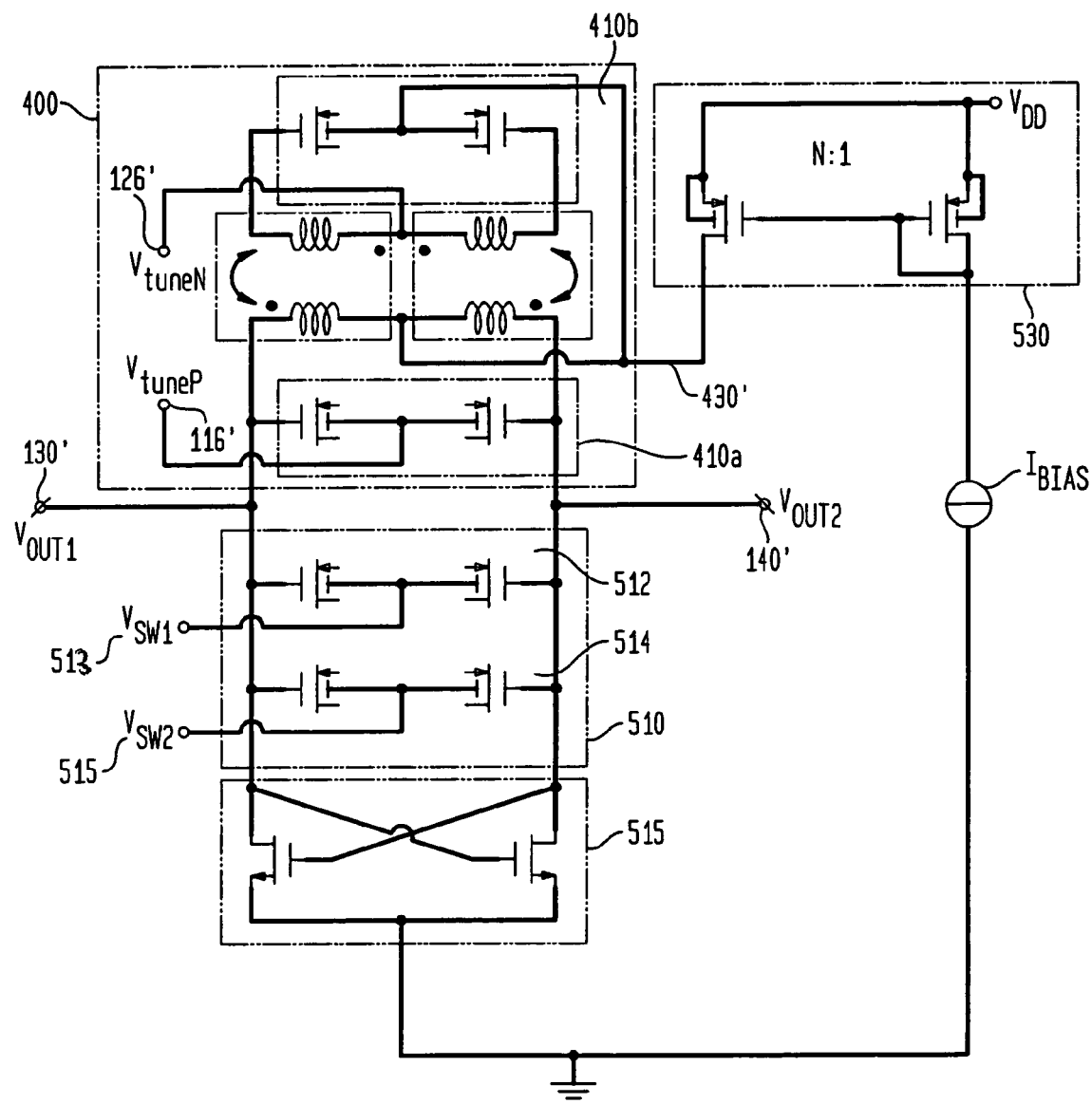
FIG. 5 illustrates an exemplary application of the single-type tuner shown in FIG. 4.

FIG. 5 illustrates a schematic diagram 500 of an exemplary multi-band oscillator in accordance with the principles of the invention. In this exemplary application, the outputs of single-type varactor differential tuner 400, i.e., nodes 130' and 140', are coupled to bandswitcher circuit 510, and to negative resistance transconductor 515. Transconductor 515 is well known in the art to provide a negative resistance that compensates for losses in the circuit to maintain the oscillation of signals $V_{out1}$ 130 and $V_{out2}$ 140.

In this exemplary embodiment, the average or DC value of the voltage at the gate-side of varactor section 410a and the well-side of varactor section 410b are maintained at a fixed voltage determined by $V_{bias}$ 430. In this illustrated example, $V_{bias}$ 430 is maintained at roughly half the supply voltage $V_{DD}$ due to the voltage drop across transconductor 515 resulting from a current that is supplied through current mirror 530. Tuning voltages $V_{tunep}$ 116 and $V_{tunen}$ 126 are applied about a common voltage level equal to half the supply voltage as well. This varactor biasing approach is advantageous as it assures a maximum differential tuning voltage range over which the oscillator may be tuned linearly. Thus, the output signal waveforms $V_{out1}$ 130 and $V_{out2}$ 140 are positioned symmetrical with respect to the sum of the C(V) curves, i.e., $C_1$ and $C_2$, thus giving the largest possible differential tuning voltage range over which the steep transition regions between the maximum and minimum capacitance values of curves $C_1$ and $C_2$ fall within the coverage range of the output waveform $V_{out1}$. This is related to the fact that the C(V) curve of the accumulation-depletion varactor used is point symmetrical approximately around the point where the voltage between gate and well is zero volts as shown in FIGS. 2a and 2b).

Bandswitcher 510 allows, in this illustrated case, for four switched tuning bands that are binary controlled by voltage signals $V_{sw1}$ 513 and $V_{sw2}$ 515. Band-switching is implemented, in this case, by applying an appropriate voltage level to the well-side of the varactors in either or both of the varactor stages 512, 514. In this illustrated case, four states of band-switching are achieved by the application of combinations of the supply voltage, e.g., $V_{DD}$, or ground (e.g., 0 volts) to each of the varactor stages.

Current mirror 530 provides a bias voltage to tuner 400 as previously described with regard to FIG. 4, i.e., bias voltage 430. Current mirrors are well-known in the art and need not be described in detail herein.

Figure 6:
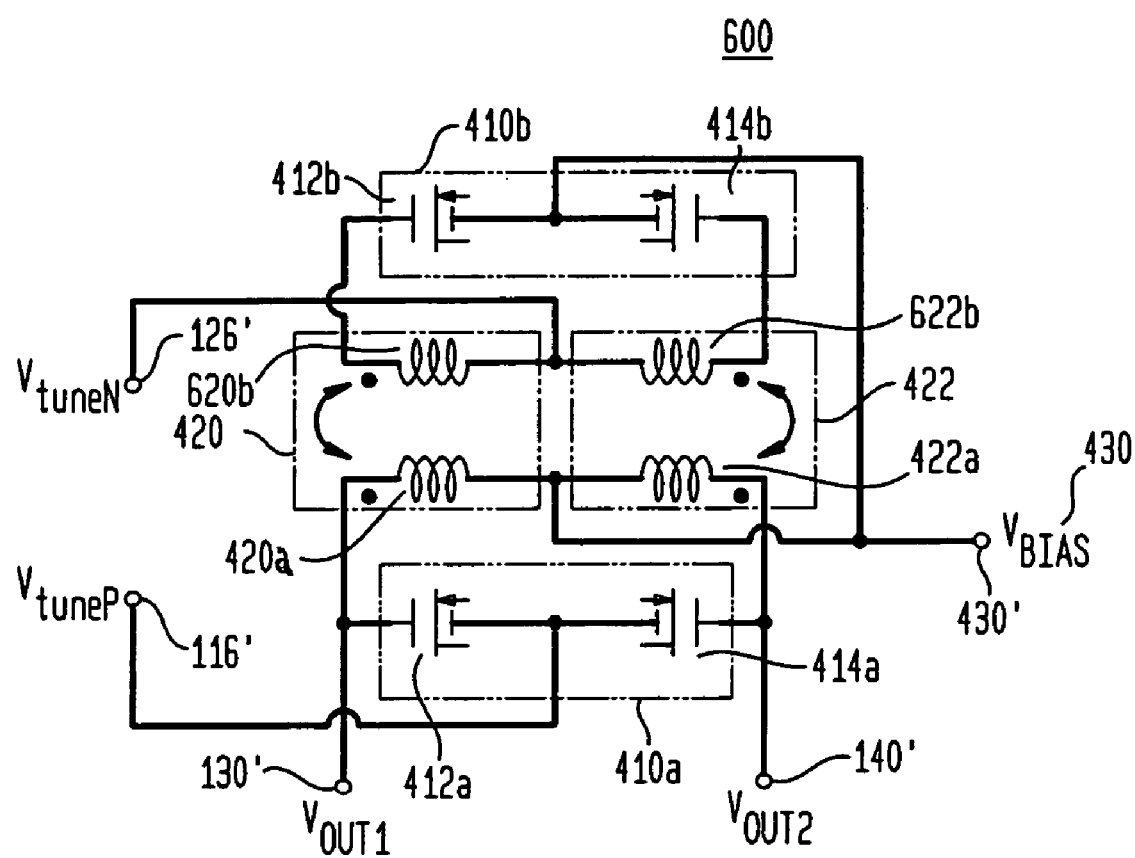
FIG. 6 illustrates a second exemplary embodiment of a single-type tuner in accordance with the principles of the invention.

FIG. 6 illustrates a second exemplary embodiment of a single-type varactor in accordance with the principles of the invention. In this illustrated embodiment, the circuit is identical to that of FIG. 4, except that the windings of inductor 620b and 622b are reversed. In this case, the oscillation signals on the primary and secondary side of the coupled inductors are now in-phase. An analysis of the varactor small-signal capacitances now yields C(V) curves as depicted in FIGS. 7a–7c for differential-mode tuning and FIGS. 8a–7c for common-mode tuning.

Figure 7A:
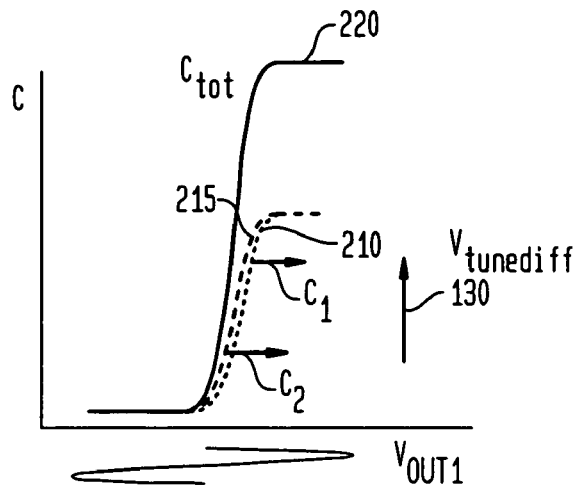
FIGS. 7a–7c illustrate the operating characteristics of the tuner shown in FIG. 6 operating in differential mode.
Figure 7B:
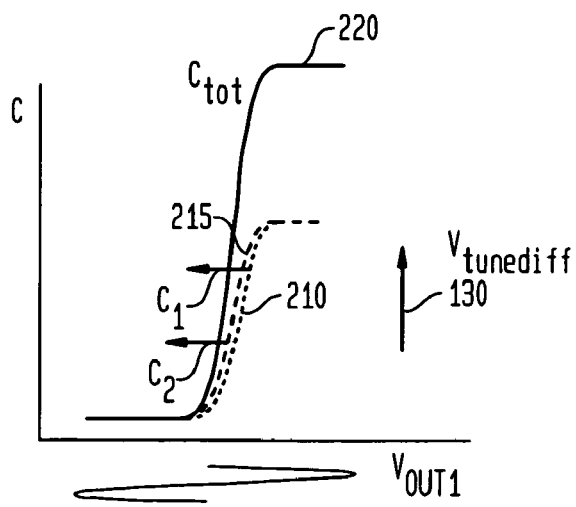
Figure 7C:
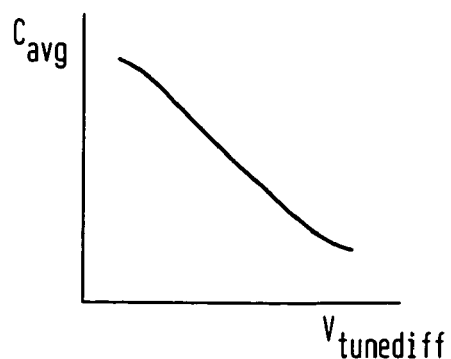

With regard to FIG. 7a, as the voltage $V_{tunediff}$ 130 increases, the capacitance of $C_1$ 210 and $C_2$ 215 shifts at a similar rate to the right in FIG. 7a and the total capacitance $C_{tot}$ 220 also shifts to the right in FIG. 7a. With regard to FIG. 7b, as the voltage $V_{tunediff}$ 130 decreases, the capacitance curves of $C_1$ 210 and $C_2$ 215 shift at a similar rate to the left in FIG. 7b and the total capacitance $C_{tot}$ 220 also shifts to the left in FIG. 7b. FIG. 7c illustrates that the overall capacitance $C_{tot}$ 220, averaged over one period of the oscillation waveform, yields an average capacitance $C_{avg.}$ that decreases as the differential tuning voltage increases in a manner similar to that shown in FIG. 2c.

Figure 8A:
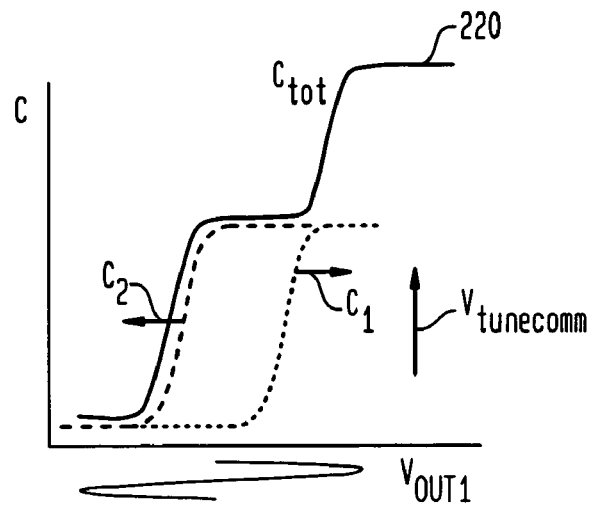
FIGS. 8a–8c illustrate the operating characteristics of the tuner shown in FIG. 6 operating in common mode.
Figure 8B:
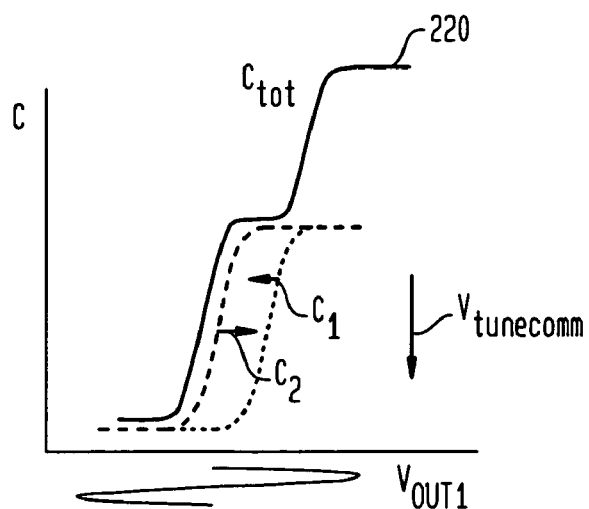
Figure 8C:
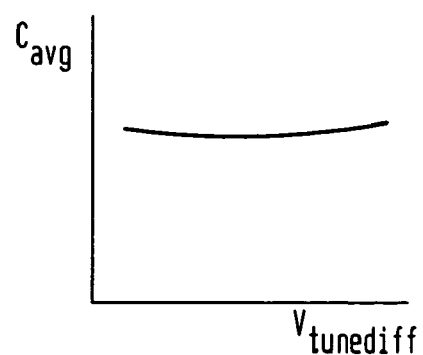

FIGS. 8a and 8b illustrate the change in total capacitance $C_{tot}$ 220 as the voltage $V_{tunecomm}$ increases and decreases, respectively. FIG. 8c illustrates that the overall capacitance $C_{tot}$ 220 averaged over one period of the oscillation waveform yields an average capacitance $C_{avg.}$ that remains substantially constants as the voltage $V_{tunecommon}$ increases in a manner similar to that shown in FIG. 3c.

Figure 9:
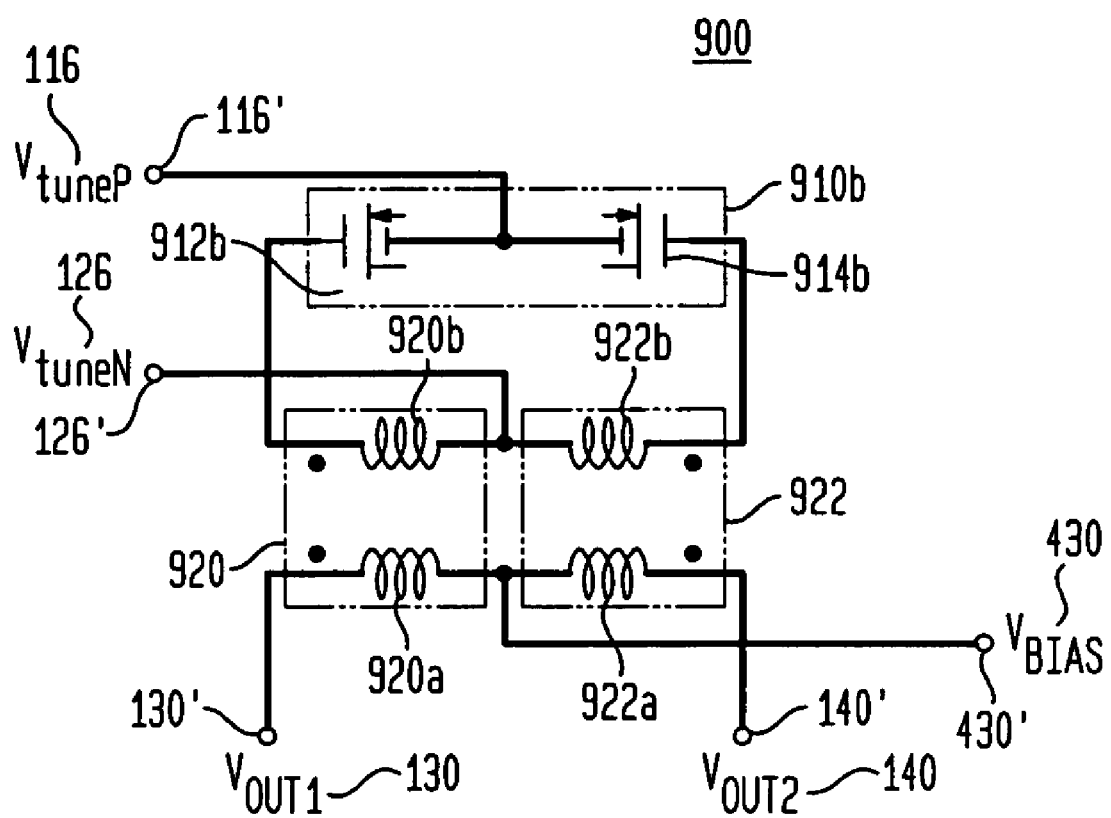
FIG. 9 illustrates another exemplary embodiment of a single type tuner in accordance with the principles of the present invention.

FIG. 9 illustrates a third exemplary embodiment 900 of a single-type varactor differential tuner in accordance with the principles of the invention. In this embodiment a single varactor stage 910b is tuned by applying at node 116' voltage $V_{tunep}$ 116 to the well-side of serially connected varactors 912b and 914b. Electrically connected to the gate-side of varactors 912b and 914b is one end of inductor elements 920b and 922b, which are electrically connected in series. Voltage $V_{tunen}$ is applied to a common node of inductors 920b and 922b, and thus applied to the gate-side of varactors 912b and 914b. Inductors 920b and 922b are electromagnetically coupled to inductors 920a and 922a, which are also connected in series. Voltage $V_{bias}$ 430 is applied to a common node of inductors 920a and 922a and is thus superimposed on output voltages $V_{out1}$ 130 and $V_{out2}$ 140. In this illustrated embodiment, the voltage across the varactor, which sets the capacitance value of the varactor, is directly determined by the differential tuning voltage $V_{tunediff}$, i.e., $V_{tunep} - V_{tunen}$.

However, when $V_{tunep}$ 116 and $V_{tunen}$ 126 vary in common-mode manner, the voltage across the varactor does not change and thus the capacitance and frequency of oscillation remain substantially unchanged.

To ensure a maximum differential tuning voltage range over which the oscillator tunes linearly, again the common mode value of the tune voltages $V_{tunep}$ 116 and $V_{tunen}$ 126 are selected substantially equal to approximately half the supply voltage.

While there has been shown, described, and pointed out fundamental novel features of the present invention as applied to preferred embodiments thereof, it will be understood that various omissions and substitutions and changes in the apparatus described, in the form and details of the devices disclosed, and in their operation, may be made by those skilled in the art without departing from the spirit of the present invention. It is expressly intended that all combinations of those elements that perform substantially the same function in substantially the same way to achieve the same results are within the scope of the invention. Substitutions of elements from one described embodiment to another are also fully intended and contemplated.

We claim:

1. A voltage-controlled oscillator comprising:
a plurality of inductor elements;
a varactor element connected in parallel with first of said inductor elements, said varactor element comprising serially-connected first and second same-type varactors, each having a well side and a gate side;
first means for applying a first tuning voltage to a node common to the first of said inductor elements, and for applying said first tuning voltage to said gate-side of each of said first and second same-type varactors;
second means for applying a second tuning voltage to a node common to said well-sides of said first and second same-type varactors; and
third means for applying a bias voltage to a node common to second of said inductor elements.

2. A voltage-controlled oscillator comprising:
a plurality of inductive elements comprising inductively coupled first and second inductor elements, wherein said first inductor elements are series connected, and said second inductor elements are series connected;
a varactor element connected in parallel with said first inductor elements, said varactor element comprising serially-connected first and second same-type varactors, each having a well side and a gate side;
first means for applying a first tuning voltage to a node common to said first inductor elements, and for applying said first tuning voltage to said gate-side of each of said first and second same-type varactors;
second means for applying a second tuning voltage to a node common to said well-sides of said first and second same-type varactors;
said first and second inductor elements of corresponding inductive elements being commonly wound; and
said first and second inductor elements are mutually coupled in-phase.

3. A voltage-controlled oscillator comprising:
a plurality of inductively coupled inductor elements;
a first varactor element connected in parallel with a first of said inductor elements, said varactor element comprising serially-connected first and second same-type varactors, each having a well side and a gate side;
first means for applying a first tuning voltage to a node common to the first of said inductor elements, and for applying said first tuning voltage to said gate-side of each of said first and second same-type varactors;

second means for applying a bias voltage to a node common to said well-sides of said first and second same-type varactors; and a second varactor element connected in parallel with second of said inductor elements, said second varactor element comprising serially-connected same-type third and fourth varactors, each having a well side and a gate side; and third means for applying a second tuning voltage to a node common to said third and fourth varactors, and at said well-sides of said third and fourth varactors.

4. The oscillator as recited in claim 3, wherein said second voltage comprises a bias voltage.

5. The oscillator as recited in claim 3, wherein, said first and second inductor elements of corresponding inductive elements are reversely wound; and corresponding said first and second inductor elements are mutually coupled out of-phase.

6. The oscillator as recited in claim 1, wherein said bias voltage is substantially equal to the common-mode value of said first and second tuning voltages, said common-mode value being substantially equal to half of an input supply voltage for said oscillator.

7. A multi-frequency band, voltage controlled tuner comprising:

a parallel arrangement comprised of a voltage controlled oscillator, a multi-band switching means and a transconductor; and first means for providing a bias voltage to said oscillator said oscillator comprising; first and second inductively coupled inductor elements having serially connected first inductor elements, serially connected second inductor elements, and first and second varactor elements, each comprising serially connected first and second same-type varactors electrically connected in parallel with said first inductor elements and said second inductor elements, respectively;

second means for providing common node voltages to a common node within each of said first and said second varactor elements; and said common node further being common to said first inductor elements, and common to said second inductor elements.

8. The tuner as recited in claim 7, wherein said common node voltages comprise; a first tuning voltage, a second tuning voltage and a bias voltage.

9. The tuner as recited in claim 7, wherein said multi-band switching means comprises:

a plurality of further varactor elements electrically connected in parallel, each of said further varactor elements comprising two further varactors serially connected at a well-side of a corresponding said further varactor element, and third means for applying a voltage to a common node of said two further varactors.

10. The tuner as recited in claim 7, wherein said transconductor comprises a negative resistance device.

11. The tuner as recited in claim 7, wherein said first means comprises a source of current or voltage to provide said bias voltage.

12. The tuner as recited in claim 7, wherein said bias voltage is substantially equal to the common node values of said common node voltages.

13. The oscillator as recited in claim 1, wherein, said first and second inductor elements are inductively coupled, said first inductor element comprises series connected first inductors, and said second inductor element comprises series connected second inductors.

14. The oscillator as teethed in claim 3, wherein, said first inductor element comprises series connected first inductors, and said second inductor element comprises series connected second inductors.

* * * * *